Nov. 1, 1966 R. W. KEYES 3,283,220
MOBILITY ANISOTROPIC SEMICONDUCTOR DEVICE
Filed July 24, 1962

INVENTOR.
ROBERT W. KEYES
BY *Alvin J. Riddles*
ATTORNEY

United States Patent Office 3,283,220
Patented Nov. 1, 1966

3,283,220
MOBILITY ANISOTROPIC SEMICONDUCTOR DEVICE

Robert W. Keyes, White Plains, N.Y., assignor to International Business Machines Corporation, New York, N.Y., a corporation of New York Filed July 24, 1962, Ser. No. 212,014
4 Claims. (Cl. 317—235)

This invention relates to semiconductors; and, in particular, to improvements in semiconductor electrical structures.

A semiconductor, in essence, operates by the placing of electrical conductivity supporting carriers in an environment that is essentially an insulator. One of the parameters of the semiconductor, which directly affects its performance, is that of the mobility of the electrical conductivity supporting carriers within the insulating environment. Recent developments in the art of semiconductors has established that there are differences in the mobility of the electrical conductivity supporting carriers in the insulating environment of certain semiconductors and that these differences are influenced by the physical orientation of the insulating environment. In other words, recent studies in the semiconductor technology have established that carriers move at different rates in different directions through a semiconductor crystal. These studies have also established the existence of a rapidly growing class of semiconductor materials which exhibit this directionally oriented difference in mobility of electrical conductivity supporting carriers. The difference in mobility of electrical conductivity supporting carriers with respect to direction of the crystal is referred to in the semiconductor art as "mobility anisotropy."

What has been discovered is a structural principle in semiconductor device technology wherein the effects of mobility anisotropy in the semiconductor crystal are employed in the form of particular materials physically oriented in particular directions as a useful tool which is employed to enhance the performance of the semiconductor device. In accordance with the teaching of the invention, semiconductor material exhibiting a difference in mobility is employed in selected regions of a semiconductor device with the directions of greater and lesser mobility chosen with respect to the device electrodes and the types of carriers involved in the device in order to enhance performance with respect to certain parameters while at the same time, to inhibit deleterious effects that have previously imposed limitations on the device.

It is an object of this invention to provide a semiconductor device employing a semiconductor crystal exhibiting mobility anisotropy.

It is another object of this invention to provide an improved semiconductor crystal device having the higher mobility crystalline direction optimally oriented with respect to the device electrodes.

It is another object of this invention to provide an improved injection efficiency semiconductor "p-n" junction.

It is another object of this invention to provide an improved junction transistor.

It is another object of this invention to provide an improved junction transistor having a high emitter efficiency and a low base resistance.

It is another object of this invention to provide a junction transistor exhibiting reduced surface recombination.

It is another object of this invention to provide an improved filamentary transistor.

The foregoing and other objects, features and advantages of the invention will be apparent from the following more particular description of a preferred embodiment of the invention, as illustrated in the accompanying drawings.

Figure 1:
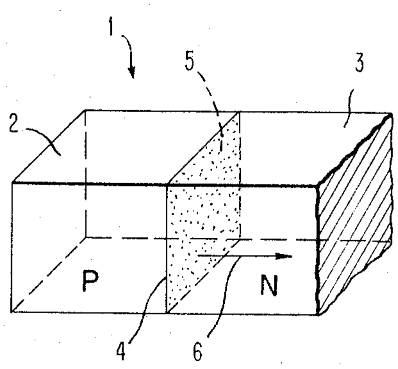
FIG. 1 is a view of a body of semiconductor material containing a "p-n" junction illustrating the optimal orientation of carrier mobility to enhance injection efficiency.

Mobility anisotropy may be defined as a directionally oriented difference in the ability of electrical conductivity supporting carriers to move throughout the monocrystalline environment of a semiconductor. The difference in mobility is generally greatest in directions that are relatively perpendicular.

Mobility anisotropy may exist with respect to different types of carriers, that is, holes and electrons as well as with respect to carriers of the same sign.

As the semiconductor art is developing, a growing number of semiconductor materials have been found to exhibit the property of mobility anisotropy. Of these, some of the better known are the class of II–V intermetallic compounds of which cadmium di-arsenide ($CdAs_2$) is a member, titanium di-oxide ($TiO_2$) (known as "Rutile"), tellurium (Te), bismuth telluride ($Bi_2Te_3$) and the mono-atomic semiconductor materials germanium (Ge) and silicon (Si) under elastic strain.

There is substantial effort to study this property in the art and the class of semiconductor materials that have been found to exhibit mobility anisotropy is rapidly growing.

The following literature citations are provided to enable one skilled in the art to acquire some background in practicing the invention.

"Electrical and Optical Properties of Rutile Single Crystals" by D. C. Cronemeyer, in The Physical Review, vol. 87, p. 876, 1952.

"Recent Studies of Bismuth Telluride and Its Alloys" by H. J. Goldsmid, in Journal of Applied Physics, vol. 32, p. 2198, 1961.

"Galvanomagnetic Properties of N-Type $CdAs_2$" by A. S. Fischler, in The Physical Review, vol. 122, pp. 425–429, 1961.

"Electrical and Optical Properties of the II–V Compounds" by W. J. Turner, A. S. Fischler, and W. E. Reese, in Journal of Applied Physics Supplement, vol. 32, No. 10, pp. 2241–2245, October 1961.

"Physical Properties of Several II–V Semiconductors" by W. J. Turner, A. S. Fischler, and W. E. Reese, in The Physical Review, vol. 121, No. 3, pp. 759–767, February 1, 1961.

The phenomenon of mobility anisotropy, in accordance with the invention, may be empolyed as a tool to enhance substantially the performance of a semiconductor device. The performance enhancement results through proper orientation of a selected material for the semiconductor crystal with respect to the device electrodes and the carriers involved so that, in essence, the property of mobility anisotropy operates to provide greatest mobility in the direction of the current that contributes to device performance and lesser mobility in the direction associated with deleterious parameters. Since different semiconductor structures employ different types of carries for different purposes to achieve the performance ends of the particular device, the property of mobility anisotropy as a tool in device constructions will be employed in several ways.

It will be apparent to one skilled in the art that the roles of the electrons and holes in the following discussion can be exchanged so that the principles set forth are equally applicable to opposite conductivity type structures.

The property of mobility anisotropy may be used to enhance minority carrier injection efficiency by providing high injected carrier mobility. Referring to FIG. 1, there is shown a minority carrier injecting electrode suitable for use in a semiconductor device constructed in accordance with the teachings of the invention. The device illustrated is a semiconductor crystal 1, having one end shown broken to indicate application to a further structure and containing sufficient impurity type and distribution to provide a "p" conductivity type region 2 and an "n" conductivity type region 3, separated by a "p-n" junction 4. The purpose of the device of FIG. 1 for the conductivity types illustrated is to inject holes into the "n" region 3.

In accordance with the invention, the semiconductor crystal 1 will have the property of mobility anisotropy with respect to relative mobilities of electrons and holes. The crystal 1 is physically oriented with respect to the plane 5 of the "p-n" junction 4 so that the ratio of the component of hole mobility in the direction 6 perpendicular to the "p-n" junction 4 to the component of electron mobility in the direction 6 is a maximum.

In service as a minority carrier injecting electrode in a semiconductor device, the "p-n" junction 4 injects holes into the "n" type region 3 from the "p" type region 2. The efficiency of a "p-n" junction as a minority carrier injecting electrode or emitter has been theoretically established to be the number of holes injected compared to the total current across the junction 4; and, the efficiency of such an emitter has been found to be sensitive to the ratio of hole mobility to electron mobility in the region into which the holes are injected. In the case under illustration, this is in the "n" region 3. The efficiency of the "p-n" junction 4 as an emitter, in accordance with the invention, may be increased by increasing the ratio of the hole mobility to electron mobility in the direction essentially perpendicular to the plane 5 of the junction 4. In particular, a low electron mobility will favor high efficiency of the junction 4 as a hole emitter; and, further, since the basic function of the junction 4 is that of an injector of holes, the mobility of the holes will be a governing factor in a current that is responsible for the performance of the device to which the injecting electrode is applied; hence, a high hole mobility will also favor high injection efficiency of the junction 4.

In the event that the device of FIG. 1 were to be employed as a junction diode, by applying ohmic contacts to the "p" region 2 and the "n" region 3, the improved injection efficiency would result in a lower series resistance through the diode.

Where the device of FIG. 1 is used as a part of a device wherein the transport efficiency of injected minority carriers is an important parameter in performance, since injected holes as minority carriers must move through the crystal 3 to another electrode in order to provide device operation in accordance with the invention, the "n" region 3 adjacent the junction 4 will have the largest hole mobility in a direction, with respect to the plane 5 of the junction 4, that is directly to the electrode of the device to which the injected holes are to migrate. In most device geometries this direction is perpendicular to the plane 5 of the junction 4 and simultaneously the lowest electron mobility will be in the direction toward the plane 5 of the junction 4.

It will be apparent to one skilled in the art that many of the advantages of the invention may be achieved even if the mobility anisotropy requirement is present in only one region.

In a typical example, the region 2 may be of one semiconductor material, such as germanium (Ge) forming a heterojunction 4 with a single crystal region 3 of bismuth telluride ($Bi_2Te_3$) having the "C" tetragonal crystallographic axis perpendicular to the plane 5 of the junction 4.

Where the semiconductor device employs both majority and minority carriers, the property of mobility anisotropy as a tool is used in a different manner as follows.

Figure 2:
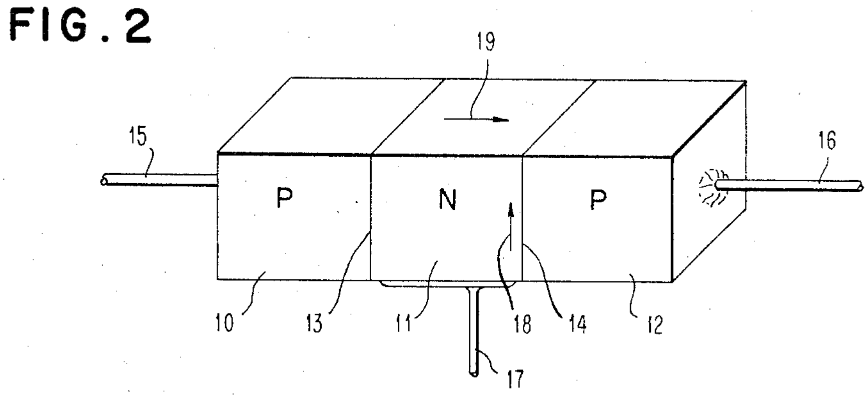
FIG. 2 is a view of an improved junction transistor illustrating the effect of the application of mobility anisotropy to the base region thereof.

Referring next to FIG. 2, in accordance with the invention, the property of mobility anisotropy as a structural feature may be employed in a transistor to satisfy two conflicting requirements. The structural of FIG. 2 is a cut-away view of a conventional "p-n-p" junction transistor. In the transistor of FIG. 2, a "p" region 10 and a "p" region 12 are separated by an "n" region 11 having a width separating the emitter junction 13 and the collector junction 14 by a distance adequate for transistor action; in other words, a distance such that a minority carrier injected at 13 can diffuse to 14 during its lifetime. Ohmic contacts 15 to the emitter, 16 to the collector, and 17 to the base are provided for signal connection purposes, well known in the art.

With a typical junction transistor structure, as shown in FIG. 2, in the base region 11, in order to achieve a high gain, it will be necessary that the emitter-base junction 13 be an efficient hole emitter. This may be seen from the fact that the emitter to collector amplification factor ($\alpha$) of a junction transistor is determined by the product of the injection efficiency of the emitter, the transport factor across the base, and the efficiency of the collector as set forth in Equation 1.

*Equation 1.*—

$$\alpha=\gamma\beta\alpha^*$$

wherein:

$\gamma$=the emitter injection efficiency;

$\beta$=the transport factor of the carriers across the base region; and $\alpha^*$=the collector efficiency.

It will be apparent from this relationship that the amplification factor of a transistor varies directly with the emitter injection efficiency and that a transistor with as high an emitter injection efficiency as possible would be a desirable end. In semiconductor device practice, however, there exists a second problem, the solution of which is in conflict with optimum injection efficiency.

In circuit applications of transistors, the base resistance of the transistor is an item of importance. For example, a commonly used "gain-band width" figure of merit which serves to evaluate transistors for circuit purposes, while dependent on many parameters, is inversely proportional to the base resistance. Since it is apparent that a low electron mobility, as discussed in connection with FIG. 1, would be ideal for improvement of the hole injection efficiency of the injecting junction 4 of FIG. 1 when used as the emitting junction 13 of FIG. 2, the requirement for a high electron mobility in order to reduce base resistance is in direct opposition to this in order to have the transistor of FIG. 2 have a good gain-band width figure of merit because in this device the electrons are the majority carriers.

The property of mobility anisotropy in the semiconductor material of the transistor of FIG. 2 will, in accordance with the teachings of the invention, permit the design of a transistor in which both of these conflicting items are satisfied. In FIG. 2, the "n" type base region 11 is made of a semiconductor with mobility anisotropy with respect to different types of carriers. Since the base resistance is principally determined by a component of electron mobility parallel to the direction of the base current from the electrode 17 to the collector 12 which is essentially parallel to the plane of the "p-n" junction 14 in the direction represented by the arrow 18; whereas, the contribution of holes to the current across the emitter junction 13 is determined by the component of hole mobility perpendicular to the plane of the junction, identified by the arrow 19; so that, in accordance with the invention, an improved transistor design will involve the orientation and proper selection of the semiconductor material of the base 11 so that the highest electron mobility current is in the direction of the base or device current, as indicated by the arrow 18, and the transistor will be further improved when the highest hole mobility component is in the direction perpendicular to the junction plane, as indicated by the arrow 19.

It will be apparent to one skilled in the art that where the ring base geometries currently used in the art are employed, the optimum advantage would be gained with a crystal base region that was axially symmetric having the highest majority carrier mobility in all directions in the plane of the device junctions and having the highest minority carrier mobility in the direction perpendicular to the junctions.

In addition to the advantages recited above involving the conflicting requirements for increased injection efficiency, low base resistance, and "gain-band width" figure of merit, further additional improvements are provided.

Since, as previously discussed, the electrons have lowest mobility in the direction perpendicular to the junction, the contribution of electrons to the reverse saturation current is reduced.

It will also be apparent that electron injection into the collector and thus carrier storage in the collector will be reduced. Carrier storage may be defined as the presence of a carrier within the diffusion distance of a junction, which upon signal reversal and change of bias of the junction may migrate within its lifetime to the junction and interfere with the establishment of the junction back resistance.

An improvement in the magnitude of reverse voltage required for breakdown of junctions is achieved. Since the phenomenon of avalanche breakdown occurs by the accelerating of an electron in the field associated with a junction to a velocity, such that upon impact with an atom in the crystal, sufficient energy is present to release an electron from the atom; the reduction in mobility of the electrons in this region will substantially increase the voltage required for breakdown. With this invention the advantage of more abrupt junctions with higher reverse breakdown voltages may be achieved.

The device of FIG. 2 may be made of a body of monocrystalline semiconductor material having at least the "n" region 11 of cadmium di-arsenide ($CdAs_2$) having appropriate conductivity type doping in the respective regions 10, 11 and 12 and in which the $CdAs_2$ "n" region 11 is crystallographically oriented with the "C" tetragonal axis of the crystal parallel to the plane of the junction 13.

The property of mobility anisotropy may be structurally employed to reduce the effect of surface recombination in a semiconductor device. As set forth in Equation 1, the performance of a transistor is associated with three factors. The injection efficiency factor has been discussed in connection with FIG. 2. A second factor $\beta$, the transport factor is governed by two important losses in the semiconductor device; these are: bulk recombination and surface recombination. Of the two losses, in certain types of transistors, such as the alloy junction, the surface recombination is responsible for the greater losses due to $\beta$ and hence reduces $\alpha$.

In surface recombination, equal particle currents of holes and electrons flow to the surface. The normal component of this current due to one kind of particle at the surface may be referred to as the recombination current. The recombination current generally flows, as a result of diffusion, in a carrier concentration gradient. At the surface, this normal component of the total current vanishes as a result of combination of carriers of opposite sign. Since the current, which is being controlled by or is important in the device action, is essentially parallel to the surface, the device current and the recombination current are perpendicular to one another. Both the recombination and the device current flow in response to carrier concentration and electric potential and the response of these currents to either type of stimuli is determined by the carrier mobility. In accordance with the invention in a mobility anisotropic semiconductor, the recombination current will be determined by the components of the carrier mobilities perpendicular to the surface; whereas, the device current will be determined by the components of the carrier mobilities parallel to the surface. So that, surface recombination control in a semiconductor device may be accomplished by providing a mobility anisotropic body of semiconductor material where the surface recombination is to be controlled; that is, crystallographically oriented in such a way that the small component of mobility is perpendicular to the free surfaces. As a result of this, the device current will flow in the highest mobility direction and the recombination current is in the direction of the smaller mobility component and is hence reduced. It will then be apparent to one skilled in the art, as shown from the relationship in Equation 1, that a reduction in surface recombination results sharply in a reduction in losses and a substantial increaase in the amplification factor of any junction transistor to which the structural principle of this invention is applied.

The loss in a transistor due to surface recombination is particularly serious in connection with a different type of transistor called the filamentary transistor. The theory and operation of this type of transistor is discussed in the following references:

"Modulation of the Resistance of a Germanium Filament by Hole Injection" by W. Shockley, G. L. Pearson, M. Sparks and W. H. Brattain, in The Physical Review, vol. 76, No. 3, p. 459, 1949.

"Hole Injection in Germanium-Quantitative Studies and Filamentary Transistors" by W. Shockley, G. L. Pearson, and J. R. Haynes, in Bell System Technical Journal, vol. 28, pp. 344–366, 1949.

Electrons and Holes in Semiconductors, by W. Shockley, D. Van Nostrand, Inc., New York, 1950.

Figure 3:
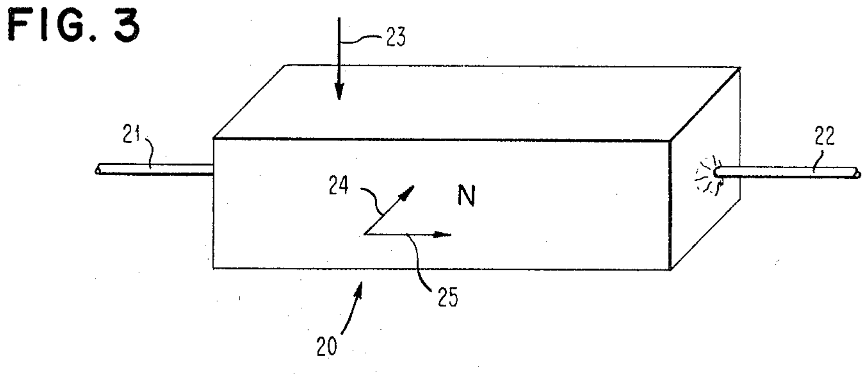
FIG. 3 is a view of a filamentry transistor illustrating the effect of mobility anisotropy on the carrier transport therein.

Referring next to FIG. 3, schematic view is provided of a filamentary transistor in which an elongated crystal body 20 of mobility anisotropic semiconductor material of "n" conductivity type is provided with ohmic contacts 21 and 22 for signaling purposes well known in the art. An emitter 23, shown for illustration as a point contact, forms a minority carrier injecting connection to the filamentary bar of semiconductor material 20 near one end.

The theory of operation of the filamentary transistor has been well established in the art, as set forth in the above references; and, in essence, for the "n" type conductivity assigned to the bar 20, it may be considered that holes are injected into the "n" material by the emitter 23 and a field applied between the contact 21 and the contact 22 sweeps the injected holes toward the contact 22. The presence of the holes and the extra electrons which are required to neutralize the space charge of the holes, increases the conductivity of the filament 20 and results in curmrent gain.

In such a device, one limitation on the gain which can be achieved is the recombination rate of the injected carriers. Recombination of the excess carriers as they drift toward the collector decreases the excess conductivity and tends to destroy the gain. The effect of recombination may be described as the product of the recombination rate constant for the excess carriers, which constant is the reciprocal of the minority carrier lifetime, and the transit time. In other words, the rate at which the carriers recombine in the period during which they are in transit. Efficient transistor action requires that the product of the recombination rate and the transit time should be small.

The surface contribution to the recombination rate is a monotonically increasing function of the perpendicular mobility component. It will therefore be apparent that the operation of this transistor can be improved by decreasing the carrier mobility perpendicular to the surface shown for one surface as vector 24, while keeping the carrier mobility parallel to the path between the electrodes shown as vector 25 at a constant or higher value. It will be further apparent that the importance of these effects depends upon the importance of the surface and volume recombination rates in the device configuration. Anisotropy of the mobility of only one of the charge carriers will produce the advantages of the invention. Since the diffusion to the surface is ambipolar, it will be retarded by a reduced mobility of either type of carrier.

A device of the type of FIG. 3 may be constructed of monocrystalline "n" conductivity type cadmium diarsenide ($CdAs_2$) having electrodes 21 and 22 oriented along the "C" axis of the crystal and having the injecting electrode 23 oriented along the "A" axis thereof.

What has been described is a structural principle in semiconductor device manufacturing wherein a difference in carrier mobility with respect to crystalline orientation is employed to enhance certain device parameters and in some applications at the same time inhibiting associated deleterious effects. The advantages of the invention are achieved through the proper selection of appropriate semiconductor material combined with appropriate crystalline orientation thereof with respect to the device electrodes and the roles of the carriers involved. Since the property of mobility anisotropy may be employed in many ways, the principles of the invention have been illustrated with respect to carriers of the same sign, carriers of opposite sign and where the carrier sign is not effective. The individual illustrations show that the structural principle of the invention provides an improved injection efficiency of rectifying electrodes, the combination of improved injection efficiency and low base resistance in a transistor and the control of surface recombination in transistors.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A minority carrier semiconductor connection device comprising:

a body of monocrystalline semiconductor material;

said body containing a first region of a first semiconductor material of a first conductivity type and a second region of a different semiconductor material of opposite conductivity type;

said first and second regions being joined together at a "p-n" heterojunction;

said second region of said different semiconductor material itself including means exhibiting carrier mobility anisotropy for causing injected minority carriers to have a maximum mobility in a direction perpendicular to said p-n heterojunction and opposite type majority carriers to have a lower mobility in a direction perpendicular to said junction.

2. The device of claim 1 wherein said first semiconductor material on one side of said heterojunction is germanium;

and said different semiconductor material on the other side of said heterojunction is bismuth telluride having the "C" tetragonal axis thereof perpendicular to the heterojunction.

3. A junction transistor containing two "p-n" junctions separating three alternate conductivity type regions comprising:

a monocrystalline body characterized by:

the center conductivity type region of said transistor separating said two "p-n" junctions being a semiconductor material itself including means exhibiting carrier mobility anisotropy for causing the mobility of minority carriers in this region to be greatest perpendicular to the junctions and the mobility of majority carriers to be greatest parallel to the junctions;

and said center region semiconductor material being cadmium diarsenide having the "C" tetragonal axis thereof parallel to the junction.

4. A filamentary transistor comprising:

an elongated body of semiconductor material having two ohmic contacts on the ends thereof and having a carrier injecting contact positioned adjacent one end thereof, said monocrystalline body being characterized by:

the semiconductor material of said body being cadmium diarsenide having the "C" tetragonal axis thereof oriented perpendicular to said ohmic contacts and said material itself including means exhibiting carrier mobility anisotropy for causing the largest carrier mobility in said body to be in the direction between the ohmic contacts and the lowest carrier mobility to be in a direction perpendicular to the ohmic contacts.

References Cited by the Examiner

UNITED STATES PATENTS

| | | | |
|---|---|---|---|
| 2,852,448 | 9/1958 | Dymon | 317—237 X |
| 2,868,683 | 1/1959 | Jochems | 317—235 X |
| 2,909,716 | 10/1959 | Veith | 317—237 |
| 3,057,762 | 10/1962 | Gaus | 317—235 |
| 3,088,856 | 5/1963 | Wamjund et al. | 317—235 |
| 3,131,096 | 4/1964 | Sommers | 317—234 |
| 3,194,691 | 7/1965 | Dikhoff | 148—1.6 |

JOHN W. HUCKERT, *Primary Examiner.*

DAVID J. GALVIN, JAMES D. KALLAM, *Examiners.*

J. A. ATKINS, *Assistant Examiner.*